US012665569B2

(12) United States Patent　(10) Patent No.:　US 12,665,569 B2
Goto et al.　(45) Date of Patent:　Jun. 23, 2026

(54) MULTILAYER PIEZOELECTRIC SUBSTRATE FILTERS WITH CONSISTENT BAND BALANCE

(71) Applicant: SKYWORKS SOLUTIONS, INC., Irvine, CA (US)

(72) Inventors: Rei Goto, Osaka (JP); Motoyuki Tajima, Yokohama (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 249 days.

(21) Appl. No.: 18/241,353

(22) Filed: Sep. 1, 2023

(65) Prior Publication Data

US 2024/0088870 A1　Mar. 14, 2024

Related U.S. Application Data

(60) Provisional application No. 63/405,051, filed on Sep. 9, 2022.

(51) Int. Cl.
H03H 9/25　(2006.01)
H03H 9/02　(2006.01)
(Continued)

(52) U.S. Cl.
CPC .......... H03H 9/25 (2013.01); H03H 9/02574 (2013.01); H03H 9/6483 (2013.01); H03H 9/725 (2013.01)

(58) Field of Classification Search
CPC .. H03H 9/02574; H03H 9/25; H03H 9/02834; H03H 9/6483; H03H 9/02559;
(Continued)

(56) References Cited

U.S. PATENT DOCUMENTS

| 5,646,584 A | 7/1997 | Kondratyev et al. |
| 7,230,512 B1 | 6/2007 | Carpenter et al. |
(Continued)

FOREIGN PATENT DOCUMENTS

| CN | 111193486 A | 5/2020 |
| JP | 2015201887 A | 11/2015 |
(Continued)

OTHER PUBLICATIONS

Wikipedia, "LTE Frequency Bands", Feb. 16. https://web.archive. org/web/20180216172721/https://en.wikipedia.org/wiki/LTE_ frequency_bands (Year: 2018).*

*Primary Examiner* — Lincoln D Donovan
*Assistant Examiner* — Tyler J Pereny
(74) *Attorney, Agent, or Firm* — Lando & Anastasi, LLP

(57)　ABSTRACT

A die includes at least two surface acoustic wave resonators having different resonant frequencies. A first of the at least two surface acoustic wave resonators includes first inter-digital transducer electrodes having a first duty factor and disposed on a multilayer piezoelectric substrate. The multi-layer piezoelectric substrate a layer of piezoelectric material having a lower surface bonded to an upper surface of a layer of a second material different from the piezoelectric mate-rial. A second of the at least two surface acoustic wave resonators includes second interdigital transducer electrodes having a second duty factor different from the first duty factor and disposed on the multilayer piezoelectric substrate to improve band balance of a device formed from the at least two surface acoustic wave resonators.

16 Claims, 14 Drawing Sheets

(51) Int. Cl.
    *H03H 9/64*     (2006.01)
    *H03H 9/72*     (2006.01)

(58) Field of Classification Search
    CPC .... H03H 9/725; H03H 9/14541; H03H 9/145;
        H03H 9/02228; H03H 9/02992; H03H
        3/08; H03H 9/175; H03H 9/6406; H03H
        9/14582; H03H 9/64; H03H 9/6476;
        H03H 9/02102; H03H 9/02866; H03H
        9/14544; H03H 9/6489; H03H 9/706;
        H03F 2200/451; H03F 1/56; H03F
        2200/111; H03F 3/195; H03F 3/245;
        H03F 2200/387; H03F 2203/7209; H03F
        3/72
    See application file for complete search history.

(56)           References Cited

U.S. PATENT DOCUMENTS

| | | | |
|---|---|---|---|
| 7,321,183 | B2 | 1/2008 | Ebuchi et al. |
| 7,716,986 | B2 | 5/2010 | Sung et al. |
| 8,490,260 | B1 | 7/2013 | Zhgoon et al. |
| 9,438,201 | B2 | 9/2016 | Hori et al. |
| 9,497,551 | B2 | 11/2016 | Ruile et al. |
| 10,218,335 | B2 | 2/2019 | Matsuda et al. |
| 10,284,176 | B1 * | 5/2019 | Solal .................. H03H 3/08 |
| 12,334,910 | B2 * | 6/2025 | Komatsu ........... H03H 9/02842 |
| 2005/0140246 | A1 | 6/2005 | Wang et al. |
| 2010/0038993 | A1 | 2/2010 | Umeda et al. |
| 2010/0182102 | A1 | 7/2010 | Kuypers et al. |
| 2010/0194499 | A1 | 8/2010 | Wang et al. |
| 2013/0130502 | A1 | 5/2013 | Sparks et al. |
| 2014/0339957 | A1 | 11/2014 | Tajima et al. |
| 2017/0063332 | A1 | 3/2017 | Gilbert et al. |
| 2017/0214386 | A1 | 7/2017 | Kido |
| 2017/0222618 | A1 | 8/2017 | Inoue et al. |
| 2017/0250669 | A1 | 8/2017 | Kuroyanagi et al. |
| 2017/0264269 | A1 | 9/2017 | Lee et al. |
| 2017/0272051 | A1 | 9/2017 | Kurihara et al. |
| 2017/0273183 | A1 | 9/2017 | Kawasaki et al. |
| 2017/0288629 | A1 | 10/2017 | Bhattacharjee et al. |
| 2017/0359048 | A1 | 12/2017 | Yasuda |
| 2018/0013404 | A1 | 1/2018 | Kawasaki et al. |
| 2018/0316329 | A1 | 11/2018 | Guenard et al. |
| 2018/0367119 | A1 | 12/2018 | Lee |
| 2019/0288661 | A1 | 9/2019 | Akiyama et al. |
| 2020/0067482 | A1 | 2/2020 | Maki et al. |
| 2020/0358424 | A1 * | 11/2020 | Kaneda .................... H03H 9/25 |
| 2020/0358464 | A1 * | 11/2020 | Abbott ................ H03H 9/6406 |
| 2020/0366270 | A1 | 11/2020 | Matsuoka |
| 2021/0058057 | A1 | 2/2021 | Goto et al. |
| 2021/0159886 | A1 * | 5/2021 | Goto ........................ H03H 9/25 |
| 2022/0014175 | A1 | 1/2022 | Nagatomo et al. |
| 2022/0077840 | A1 | 3/2022 | Caron |
| 2024/0039516 | A1 | 2/2024 | Goto et al. |

FOREIGN PATENT DOCUMENTS

| | | |
|---|---|---|
| TW | 200531433 A | 9/2005 |
| TW | 200703898 A | 1/2007 |

* cited by examiner

DF +0.01 VELOCITY SENSITIVITY
PITCH DEPENDENCIES ESTIMATION

FILTER A

FILTER B

FREQUENCY IMBALANCE REMAINS

TRANSMISSION COEFFICIENT

FREQUENCY

– – ORIGINAL WAVE FORM

—— AFTER DF +0.01

- - - - AFTER TRIMMING BY SiN

MULTILAYER PIEZOELECTRIC SUBSTRATE FILTERS WITH CONSISTENT BAND BALANCE

CROSS-REFERENCE TO RELATED APPLICATIONS

This application claims priority under 35 U.S.C. § 119(e) to U.S. Provisional Patent Application Ser. No. 63/405,051, titled "MULTILAYER PIEZOELECTRIC SUBSTRATE FILTERS WITH CONSISTENT BAND BALANCE," filed Sep. 9, 2022, the entire content of which is incorporated herein by reference for all purposes.

BACKGROUND

Technical Field

Embodiments of this disclosure relate to acoustic wave devices including multilayer piezoelectric substrates with improved band balance.

Description of Related Technology

Acoustic wave devices, for example, surface acoustic wave (SAW) and bulk acoustic wave (BAW) devices may be utilized as components of filters in radio frequency electronic systems. For instance, filters in a radio frequency front-end of a mobile phone can include acoustic wave filters. Two acoustic wave filters can be arranged as a duplexer or diplexer.

SUMMARY

In accordance with one aspect, there is provided a die including at least two surface acoustic wave resonators having different resonant frequencies, a first of the at least two surface acoustic wave resonators including first interdigital transducer electrodes having a first duty factor and disposed on a multilayer piezoelectric substrate including a layer of piezoelectric material having a lower surface bonded to an upper surface of a layer of a second material different from the piezoelectric material, a second of the at least two surface acoustic wave resonators including second interdigital transducer electrodes having a second duty factor different from the first duty factor and disposed on the multilayer piezoelectric substrate to improve band balance of a device formed from the at least two surface acoustic wave resonators.

In some embodiments, the first of the at least two surface acoustic wave resonators has a higher resonant frequency than the second of the at least two surface acoustic wave resonators.

In some embodiments, the first interdigital transducer electrodes have a greater duty factor than the second interdigital transducer electrodes.

In some embodiments, the die further comprises a first radio frequency filter including the first of the at least two surface acoustic wave resonators and a second radio frequency filter including the second of the at least two surface acoustic wave resonators.

In some embodiments, the first radio frequency filter has a first passband and the second radio frequency filter has a second passband, the first passband having a higher center frequency than the second passband.

In some embodiments, the first and second passbands are overlapping.

In some embodiments, the first and second passbands are non-overlapping.

In some embodiments, the die further comprises a first duplexer including the first radio frequency filter and a second duplexer including the second radio frequency filter.

In some embodiments, the first duplexer includes a first transmission filter and a first reception filter for a first radio frequency band, the first radio frequency filter being one of the first transmission filter or first reception filter.

In some embodiments, the second duplexer includes a second transmission filter and a second reception filter for a second radio frequency band, the second radio frequency filter being one of the second transmission filter or second reception filter.

In some embodiments, the first radio frequency band and second radio frequency band are overlapping.

In some embodiments, the first radio frequency band and second radio frequency band are non-overlapping.

In some embodiments, each of the first duty factor and second duty factor are between 0.35 and 0.65.

In some embodiments, the die further comprises a silicon nitride trimming layer disposed on one of the first of the at least two surface acoustic wave resonators or the second of the at least two surface acoustic wave resonators.

In accordance with another aspect, there is provided an electronics module having at least two radio frequency filters formed on a same die, a first of the at least two radio frequency filters including first resonators including a multilayer piezoelectric substrate and first interdigital electrode fingers having a first duty factor disposed on the multilayer piezoelectric substrate, a second of the at least two radio frequency filters including second resonators including second interdigital electrode fingers having a second duty factor greater than the first duty factor disposed on the multilayer piezoelectric substrate.

In some embodiments, the first resonators have lower resonant frequencies than the second resonators.

In some embodiments, the electronics module further comprises at least two duplexers, a first of the at least two duplexers including the first of the at least two radio frequency filters, a second of the at least two duplexers including the second of the at least two radio frequency filters.

In some embodiments, the electronics module is included in an electronic device.

In accordance with another aspect, there is provided an electronic device with an electronics module having at least two radio frequency filters formed on a same die, a first of the at least two radio frequency filters including first resonators including a multilayer piezoelectric substrate and first interdigital electrode fingers having a first duty factor disposed on the multilayer piezoelectric substrate, a second of the at least two radio frequency filters including second resonators including second interdigital electrode fingers having a second duty factor greater than the first duty factor disposed on the multilayer piezoelectric substrate.

In some embodiments, the first resonators have lower resonant frequencies than the second resonators.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1A:
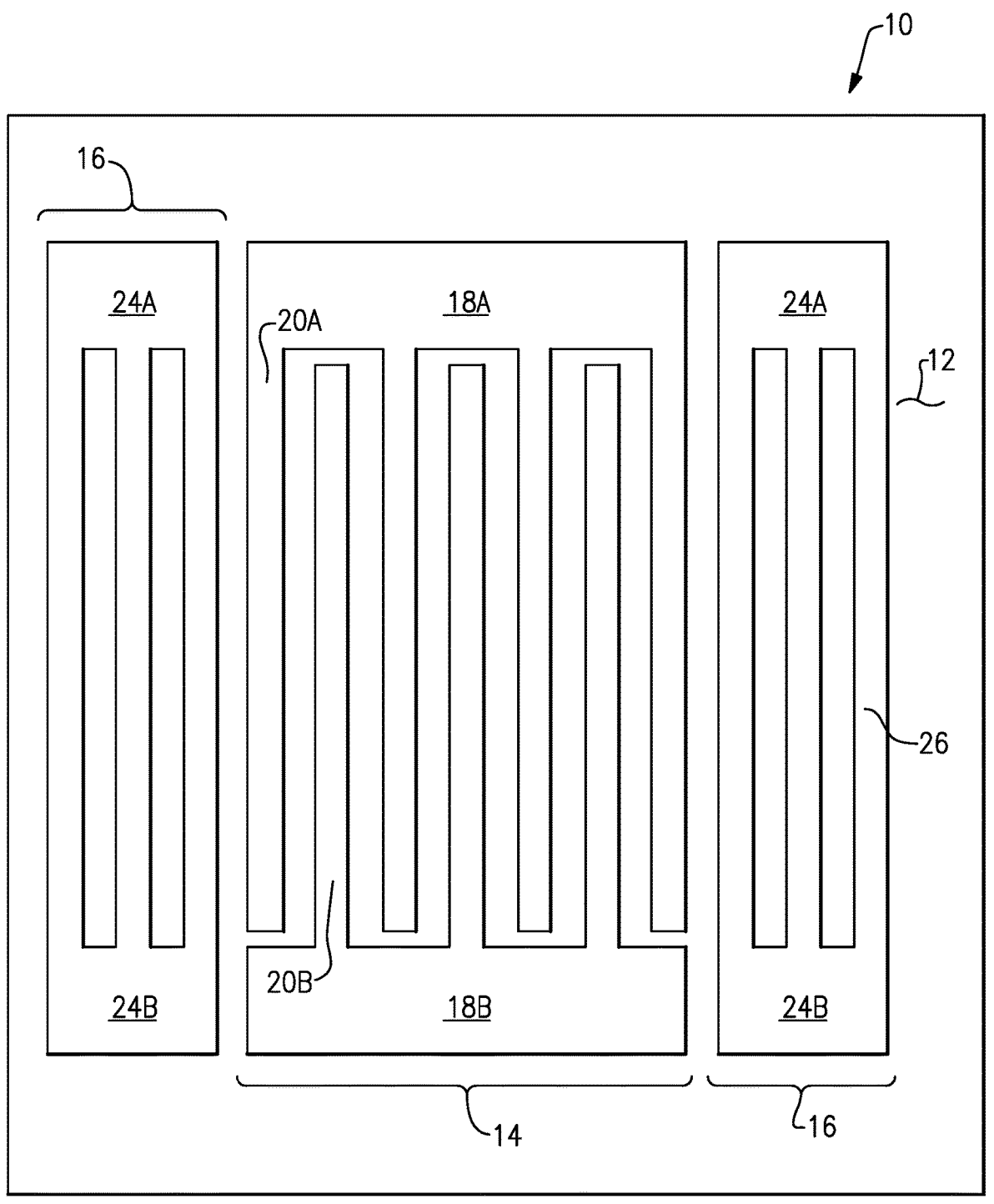
FIG. 1A is a simplified plan view of an example of a surface acoustic wave resonator.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1A is a plan view of a surface acoustic wave (SAW) resonator 10 such as might be used in a SAW filter, duplexer, balun, etc.

Acoustic wave resonator 10 is formed on a piezoelectric substrate, for example, a lithium tantalate (LiTaO$_3$) or lithium niobate (LiNbO$_3$) substrate 12 and includes interdigital transducer (IDT) electrodes 14 and reflector electrodes 16. In use, the IDT electrodes 14 excite a main acoustic wave having a wavelength λ along a surface of the piezoelectric substrate 12. The reflector electrodes 16 sandwich the IDT electrodes 14 and reflect the main acoustic wave back and forth through the IDT electrodes 14. The main acoustic wave of the device travels perpendicular to the lengthwise direction of the IDT electrodes.

The IDT electrodes 14 include a first bus bar electrode 18A and a second bus bar electrode 18B facing first bus bar electrode 18A. The IDT electrodes 14 further include first electrode fingers 20A extending from the first bus bar electrode 18A toward the second bus bar electrode 18B, and second electrode fingers 20B extending from the second bus bar electrode 18B toward the first bus bar electrode 18A.

The reflector electrodes 16 (also referred to as reflector gratings) each include a first reflector bus bar electrode 24A and a second reflector bus bar electrode 24B and reflector fingers 26 extending between and electrically coupling the first bus bar electrode 24A and the second bus bar electrode 24B.

Figure 1B:
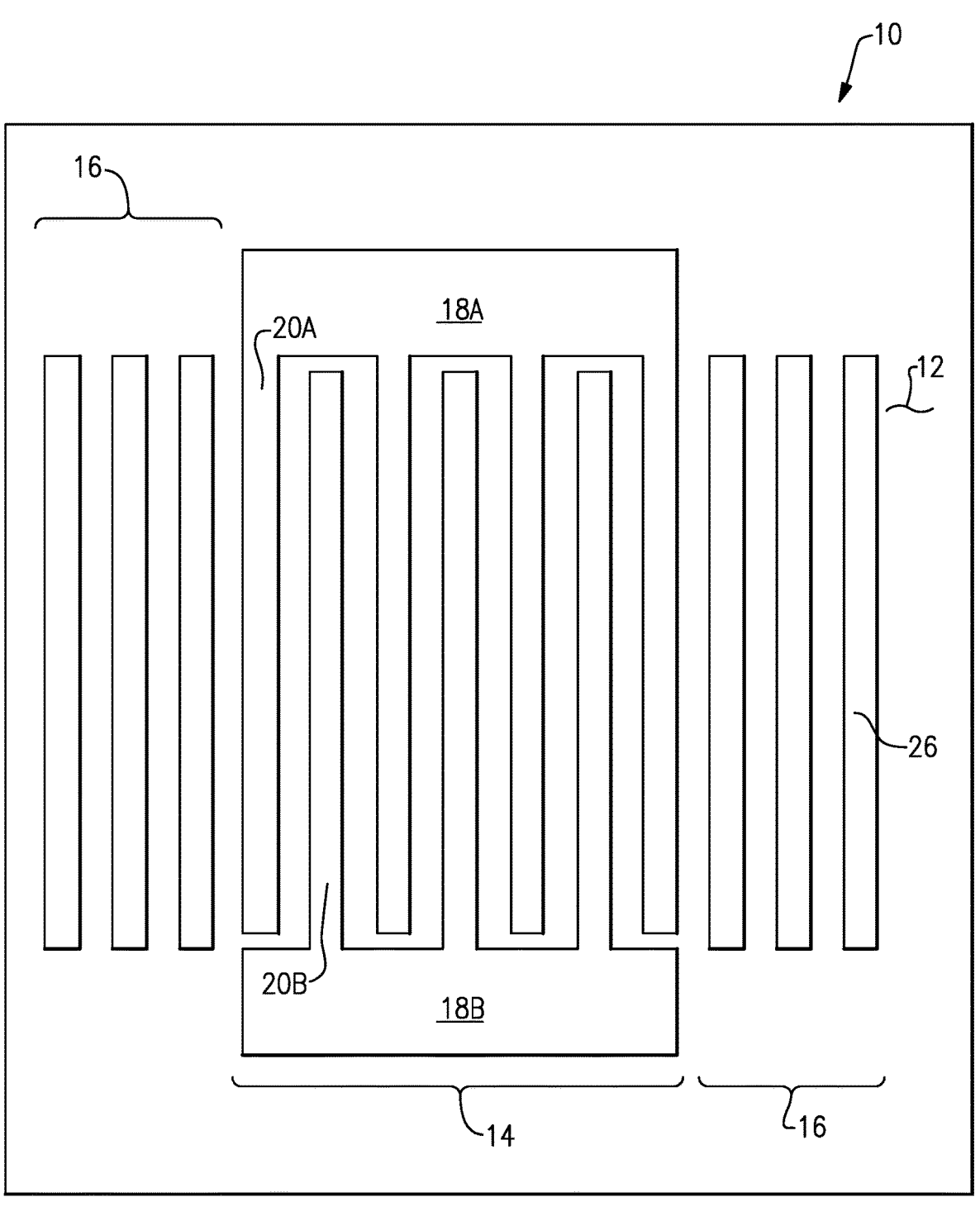
FIG. 1B is a simplified plan view of another example of a surface acoustic wave resonator.
Figure 1C:
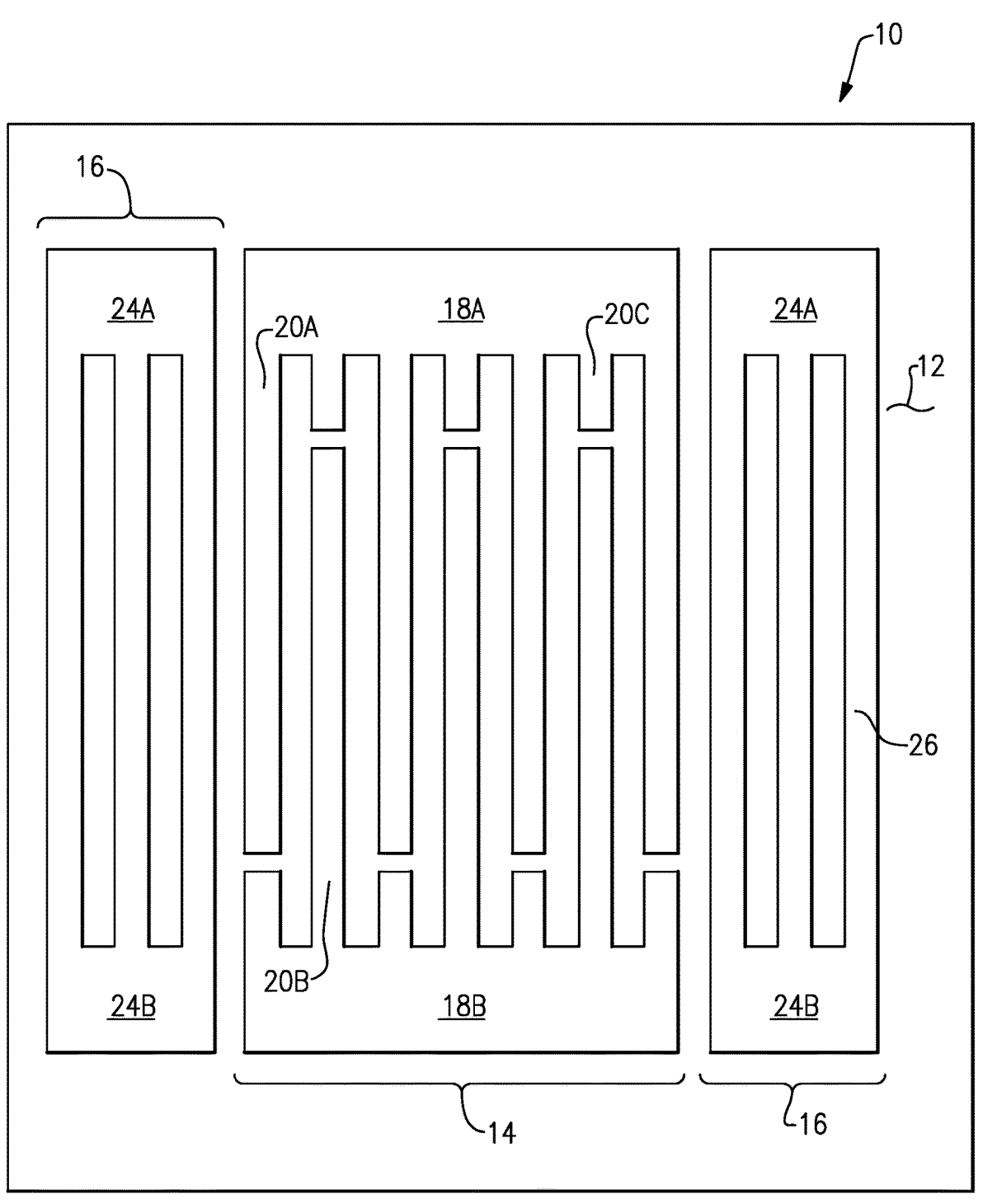
FIG. 1C is a simplified plan view of another example of a surface acoustic wave resonator.

In other embodiments disclosed herein, as illustrated in FIG. 1B, the reflector bus bar electrodes 24A, 24B may be omitted and the reflector fingers 26 may be electrically unconnected. Further, as illustrated in FIG. 1C, acoustic wave resonators as disclosed herein may include dummy electrode fingers 20C that are aligned with respective electrode fingers 20A, 20B. Each dummy electrode finger 20C extends from the opposite bus bar electrode 18A, 18B than the respective electrode finger 20A, 20B with which it is aligned.

It should be appreciated that the acoustic wave resonators 10 illustrated in FIGS. 1A-1C, as well as the other circuit elements illustrated in other figures presented herein, are illustrated in a highly simplified form. The relative dimensions of the different features are not shown to scale. Further, typical acoustic wave resonators would commonly include a far greater number of electrode fingers and reflector fingers than illustrated. Typical acoustic wave resonators or filter elements may also include multiple IDT electrodes sandwiched between the reflector electrodes.

Figure 2:
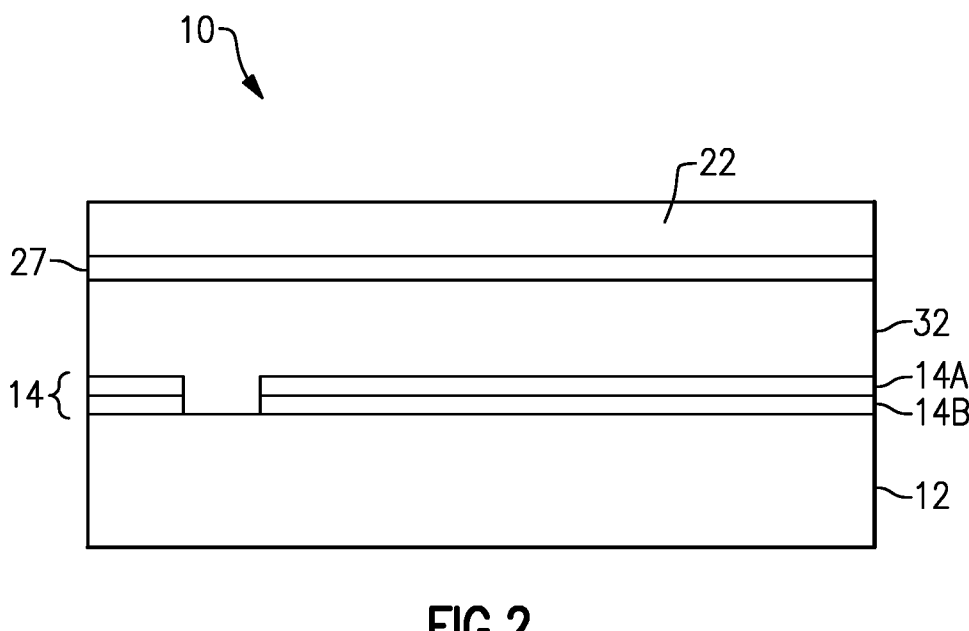
FIG. 2 is a simplified cross-sectional view of an example of a temperature compensated surface acoustic wave resonator.

As illustrated in FIG. 2, a layer of a dielectric 22 exhibiting a high acoustic wave velocity, for example, silicon nitride (Si$_3$N$_4$, also abbreviated as "SiN" herein) may be disposed over the IDT electrodes of the SAW resonator 10. In some embodiments, the layer of high acoustic wave velocity material 22 may be deposited over a dielectric material 32 having a lower acoustic wave velocity, for example, silicon dioxide (SiO$_2$) disposed over the IDT electrode structure. An intermediate layer 27 of, for example, silicon oxynitride (SiON) may optionally be disposed between the high velocity dielectric layer 22 and the lower acoustic velocity layer 32. The intermediate layer 27 may exhibit an acoustic velocity between the acoustic velocities of the layers 22 and 32.

The SiO$_2$ layer 32 may have a negative temperature coefficient of frequency, which helps to offset the positive temperature coefficient of frequency of the piezoelectric substrate 12 and reduce the change in frequency response of the SAW device with changes in temperature. A SAW device with a layer of SiO$_2$ over the IDT electrodes may thus be referred to as a temperature-compensated SAW device, or TCSAW.

As also illustrated in FIG. 2, the IDT electrodes 14 may be layered electrodes including an upper layer 14A of a highly conductive but low-density material, for example, aluminum (Al), and a lower layer 14B of a more dense material, for example, molybdenum (Mo), tungsten (W), copper (Cu), gold (Au), silver (Ag), platinum (Pt), ruthenium (Ru), or iridium (Ir). The denser lower layer 14B may reduce the acoustic velocity of acoustic waves travelling through the device which may allow the IDT electrode fingers to be spaced more closely for a given operating frequency and allow the SAW device to be reduced in size as compared to a similar device utilizing less dense IDT electrodes. The less dense upper layer 14A may have a higher conductivity than the lower layer 14B to provide the electrode stack with a lower overall resistivity.

Figure 3:
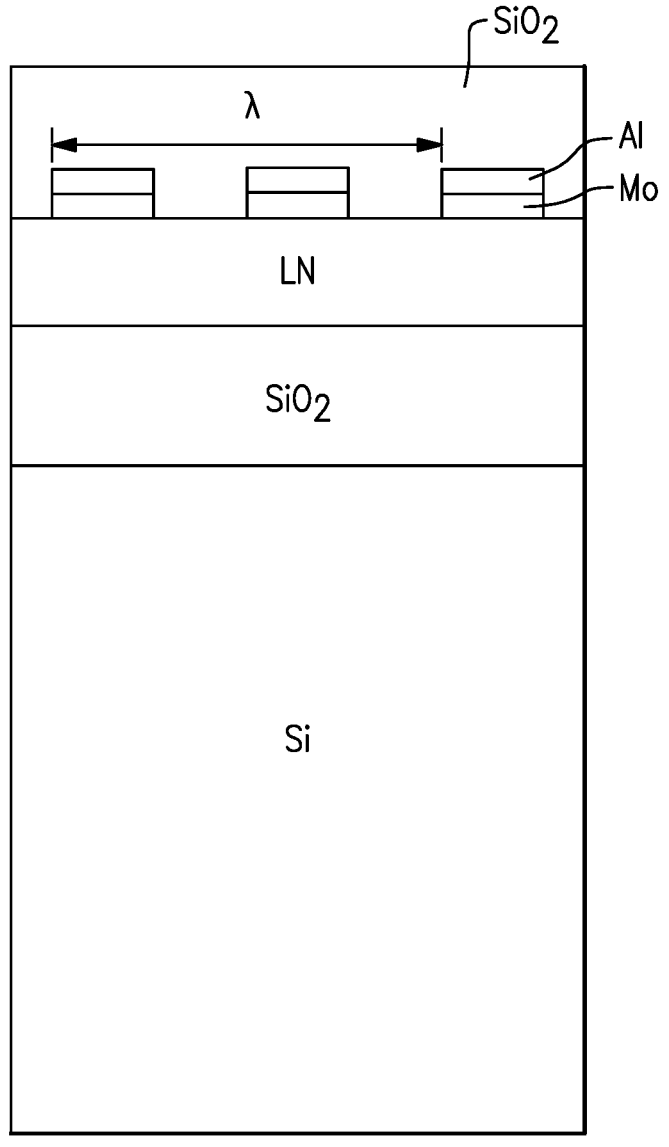
FIG. 3 is a simplified cross-sectional view of an example of a surface acoustic wave resonator having multilayer piezoelectric substrate.

Another form of SAW resonator has a configuration similar a TCSAW resonator but may include a substrate having multiple layers of material instead of a single layer of piezoelectric material as may be found in embodiments of TCSAW resonators. One example of a multilayer piezoelectric substrate (MPS) SAW resonator is illustrated in cross-section in FIG. 3. The substrate of the MPS SAW resonator includes a layer of piezoelectric material, lithium niobate (LN) in the example of FIG. 3, disposed on a lower substrate layer of silicon, with a layer of silicon dioxide optionally disposed between the silicon and piezoelectric material. The silicon may be provided in the form of a wafer that is bonded to the lower surface of a wafer of piezoelectric material opposite the upper surface of the wafer of piezoelectric material upon which features of SAW resonators, such as IDT electrodes and reflector electrodes, as well as other circuitry, for example, conductive traces, passive devices, etc., may be formed. The silicon may be bonded to the piezoelectric material via a direct fusion bond or with an adhesive, for example, a layer of silicon dioxide as illustrated in FIG. 3. In some embodiments, a layer of silicon dioxide may be grown or deposited on the lower surface of the piezoelectric material and a layer of silicon dioxide may be gown or deposited on the upper surface of the silicon material. The piezoelectric material and silicon may then be joined by anodic bonding or other methods of joining layers of silicon dioxide known in the art. The IDT and reflector electrodes may optionally be covered with a protective layer of silicon dioxide or another suitable material. In some examples, the silicon substrate layer may have a thickness of hundreds of microns (for example, about 200-350 μm), the silicon dioxide layer may have a thickness of from 1-10 μm, and the layer of piezoelectric material may have a thickness of as little as 1λ, although these dimensions are only examples and are not intended to limit embodiments disclosed herein.

Silicon has mechanical and thermal properties that may benefit SAW resonator structures when bonded to the piezoelectric substrate of the SAW resonator structures as illustrated in FIG. 3. The thermal coefficient of expansion of silicon is about 2.6 ppm/° K which is significantly lower than that of conventional materials used as piezoelectric substrates in SAW resonator structures such as lithium niobate (from about 7.5 ppm/° K to 15.4 ppm/° K, depending on crystallographic direction). Silicon has a thermal conductivity of about 1.3 W/cmK, more than 20 times the 0.06 W/cmK thermal conductivity of lithium niobate. Silicon is also significantly less fragile than lithium niobate. These properties lead to the improvements in the operating characteristics of a SAW resonator when silicon is bonded to the bottom of a lithium niobate substrate for a SAW resonator structure. Bonding the silicon to the bottom of the lithium niobate substrate may, in some examples, reduce the temperature coefficient of frequency (TCF) of the SAW resonator at the resonant frequency (fs) from about −33 ppm to about −23 ppm and at the anti-resonant frequency (fp) from about −22 ppm to about −12 ppm. Mechanical robustness, and thus wafer handling, of the lithium niobate/silicon multilayer substrate is improved relative to that of the lithium niobate substrate without the bonded silicon. Heat dissipation of the lithium niobate/silicon substrate is improved relative to that of the lithium niobate substrate without the bonded silicon. Operating parameters of the SAW resonator such as quality factor Q and coupling coefficient K2 are unaffected by the bonding of the silicon to the lower surface of the piezoelectric substrate.

It should be appreciated that MPS SAW resonator structures as disclosed herein may benefit from bonding of materials other than silicon to the lower surface of the piezoelectric substrate. Other high impedance material substrates, for example, aluminum nitride, silicon nitride, magnesium oxide spinel, magnesium oxide crystal, sapphire, etc. may be utilized instead of silicon. Further, the piezoelectric substrate is not limited to lithium niobate but may be other piezoelectric materials, for example, lithium tantalate or another piezoelectric material in different examples. Additionally, although some embodiments may include 128 degree rotated lithium niobate as the piezoelectric material of the substrate, lithium niobate with other crystallographic orientations may alternatively be utilized as the piezoelectric substrate material.

One design parameter of a SAW resonator (TCSAW or MPS SAW) that may be optimized is duty factor, also sometimes referred to as metallization ratio, that is defined as the area of the resonator in a portion of the central active region of the IDT electrodes that is covered by the metal electrodes divided by the total area of the portion of the central active region. Duty factor may also be calculated as the width of an IDT electrode divided by the length between one side of the IDT electrode and the same side of an adjacent IDT electrode in the central active region of the resonator.

Figure 4:
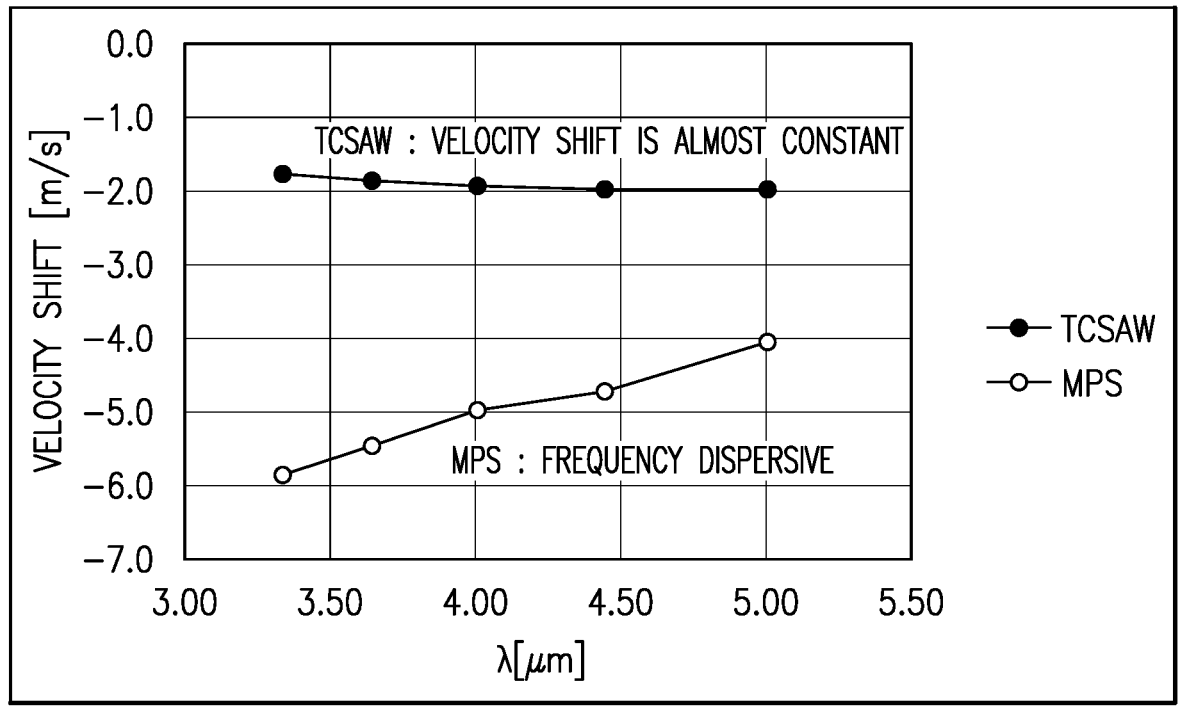
FIG. 4 illustrates the effect on acoustic velocity in temperature compensated surface acoustic wave resonators and surface acoustic wave resonator having multilayer piezoelectric substrate at different electrode pitches of a change in duty factor of the interdigital transducer electrodes of the resonators.

The duty factor of the IDT electrodes of a SAW resonator, in particular, an MPS SAW resonator, may have an effect of the resonant and antiresonant frequencies of the resonator, and thus the passband of a filter including the SAW resonator. This effect may be greater the higher the operating frequency of the resonator. FIG. 4 illustrates how the acoustic velocity in a TCSAW resonator and a MPS SAW resonator shift with a change in IDT electrode duty factor of +0.01 (+1%). As can be seen, the acoustic velocity (and, consequently, operating frequency) for both the TCSAW resonator and the MPS SAW resonator decrease with increased IDT electrode duty factor at all values of λ illustrated. The shift in acoustic velocity for the TCSAW resonator is less than that for the MPS SAW resonator. The shift in acoustic velocity for the TCSAW resonator is fairly constant at about −2 m/s for all simulated values of λ but with a slight downward trend with increasing λ. The MPS SAW resonator exhibits a shift in acoustic velocity that is highly dependent on λ, with a greater shift in acoustic velocity for smaller values of λ (with smaller values of λ corresponding to higher operating frequency). For example, at a λ of about 3.25 μm the MPS SAW resonator exhibited an acoustic velocity shift of about −6 m/s due to the IDT electrode duty factor change of 0.01, while at a λ of 5 μm, the acoustic velocity shift was lower at −4 m/s.

Figure 5A:
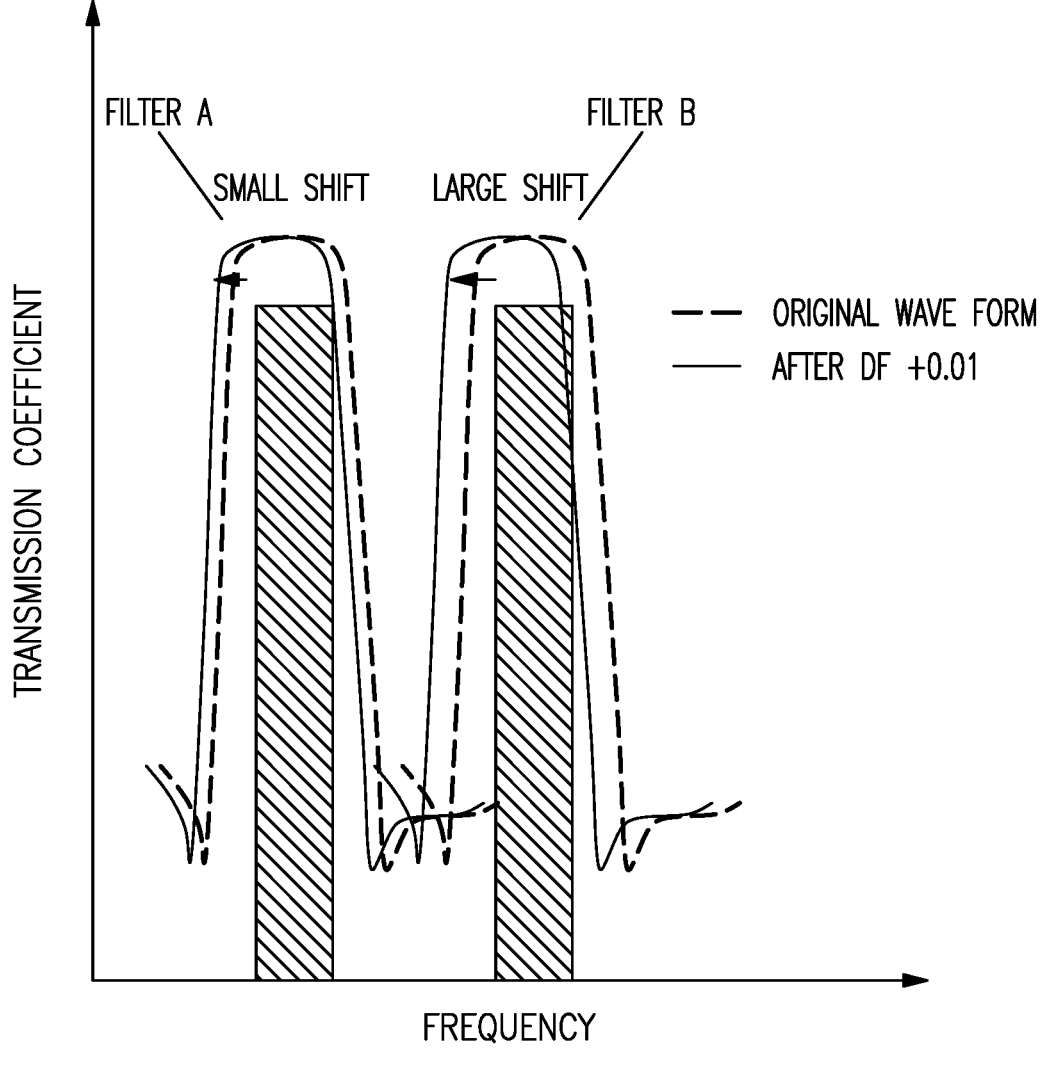
FIG. 5A illustrates the shift in passband of filters with different passbands and formed of surface acoustic wave resonators having multilayer piezoelectric substrates when the duty factor of the interdigital transducer electrodes of the resonators is increased by 0.01.

Manufacturing variability may lead to SAW resonators with IDT electrodes having duty factors that are off target and filters formed from such SAW resonators that may not exhibit desired upper and lower passband frequencies. This is schematically illustrated in FIG. 5A. FIG. 5A depicts the passband targets (rectangles) for two different filters formed from MPS SAW resonators on the same die. One of the passband targets is higher than the other. The desired admittance curves of the two different filters are illustrated in dashed lines. The admittance curves of the two different filters after a change in duty factor of the IDT electrodes of the MPS SAW resonators making up the filters of 0.01 (1%) are shown in solid lines. It can be seen that with the change in duty factor the passbands of each filter shifted downward as compared to target, with the admittance curve of the filter having the higher passband shifting downward to a greater extent than the admittance curve of the filter having the lower passband. The passband for the filter with the lower operating frequency just barely covers the whole of the desired passband. The passband for the filter with the higher operating frequency no longer covers the upper end of the desired passband. The center of the admittance curves for both filters do not correspond to the center of the desired passbands, so the set of filters may be said to exhibit band imbalance.

Figure 5B:
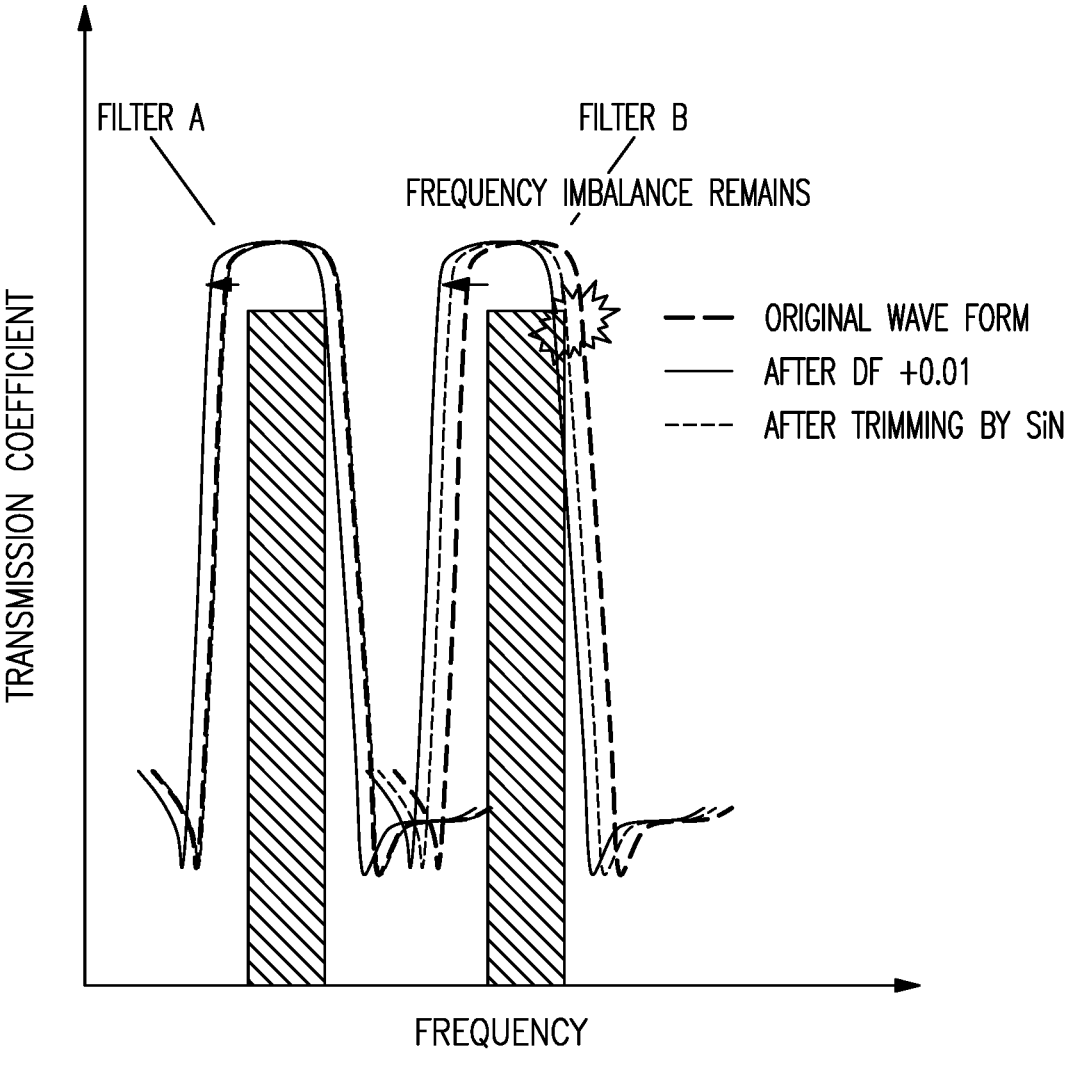
FIG. 5B illustrates how the filter passband shifts illustrated in FIG. 5A may be partially compensated for by frequency trimming with a layer of silicon nitride disposed on the surface acoustic wave resonators forming the filters.

The operating frequency of SAW resonators, and the frequency band of the admittance curves of filters formed from SAW resonators, may be adjusted by adjusting the thickness of a passivation film, for example, silicon nitride (SiN) disposed above the IDT electrodes of the resonators. This is referred to as frequency trimming. A thicker layer of SiN may increase the operating frequency of a SAW resonator to a greater extent than a thinner layer of SiN. Frequency trimming may also be accomplished by, for example, adjusting the thickness of a layer of silicon dioxide on the IDT electrodes of the resonators, by etching of the piezoelectric material of the resonators, by oxidizing of the IDT electrodes of the resonators, or by other methods known in the art. FIG. 5B illustrates the effect on the shifted admittance curves of FIG. 5A if one were to apply frequency trimming to increase the operating frequencies of the MPS SAW resonators used in the two filters to shift the passbands upward. From FIG. 5B it can be observed that frequency trimming with SiN (assuming the same thickness of SiN on the resonators of both filters) shifts the passbands of the two filters upwards by the same amount. But since the change in duty factor shifted the passband of the higher frequency filter downward to a greater extent than the lower frequency filter, even if the frequency trimming was to bring the passband of the lower frequency filter into alignment with the desired passband, the passband of the higher frequency filter would sill be misaligned with its desired passband and the band imbalance would remain.

Figure 6A:
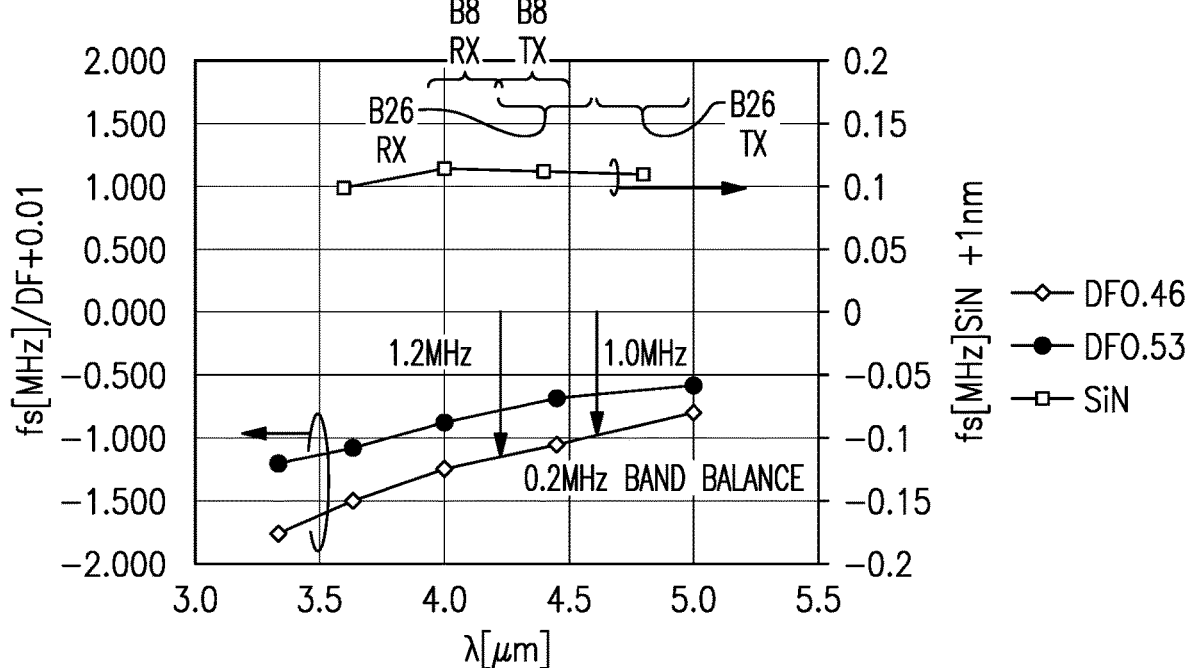
FIG. 6A illustrates the dependence of shift in resonant frequency with change in duty factor for surface acoustic wave resonators having multilayer piezoelectric substrates with different interdigital transducer electrode pitches and different target duty factors for the interdigital transducer electrodes as well as frequency shifts for these resonators due to frequency trimming with silicon nitride.

FIG. 6A illustrates the effect on IDT electrode duty factor and SiN trimming as a function of λ on the frequency shift in a MPS SAW resonator after a change in duty factor of +0.01. In FIG. 6A the vertical axes represent the shift in resonance frequency given a shift in IDT electrode duty factor of +0.01. Simulated results for two different MPS SAW resonators with target (unshifted) IDT electrode duty factors of 0.46 and 0.53 are illustrated. Also illustrated is the shift in resonance frequency that may be obtained by frequency trimming by adding 1 nm of SiN on top of the resonator structures (the "SiN" curve). The frequency bands corresponding to band 8 (B8) and band 26 (B26) are shown to illustrate the effect of shift in duty factor for resonators for filters for these bands formed on the same die. It can be seen that the resonator with the lower IDT electrode duty factor (0.46) exhibited a greater downward shift in resonant frequency than the resonator with the higher IDT electrode duty factor (0.53) for all values of λ. Frequency trimming provided an upward shift that was about constant at 1 MHz across all values of λ. The resonator with the lower IDT electrode duty factor exhibited a downward shift in resonant frequency of 1.2 MHz at a λ of about 4.2 μm, corresponding to a frequency in the center of the B8 band and a downward shift in resonant frequency of 1.0 MHz at a λ of about 4.6 μm, corresponding to a frequency in the center of the B26 band. This indicates that filters for the B8 and B26 band formed on the same die from resonators with a target IDT electrode duty factor of 0.46 that was shifted up to 0.47 would exhibit a band imbalance of 0.2 MHz.

Figure 6B:
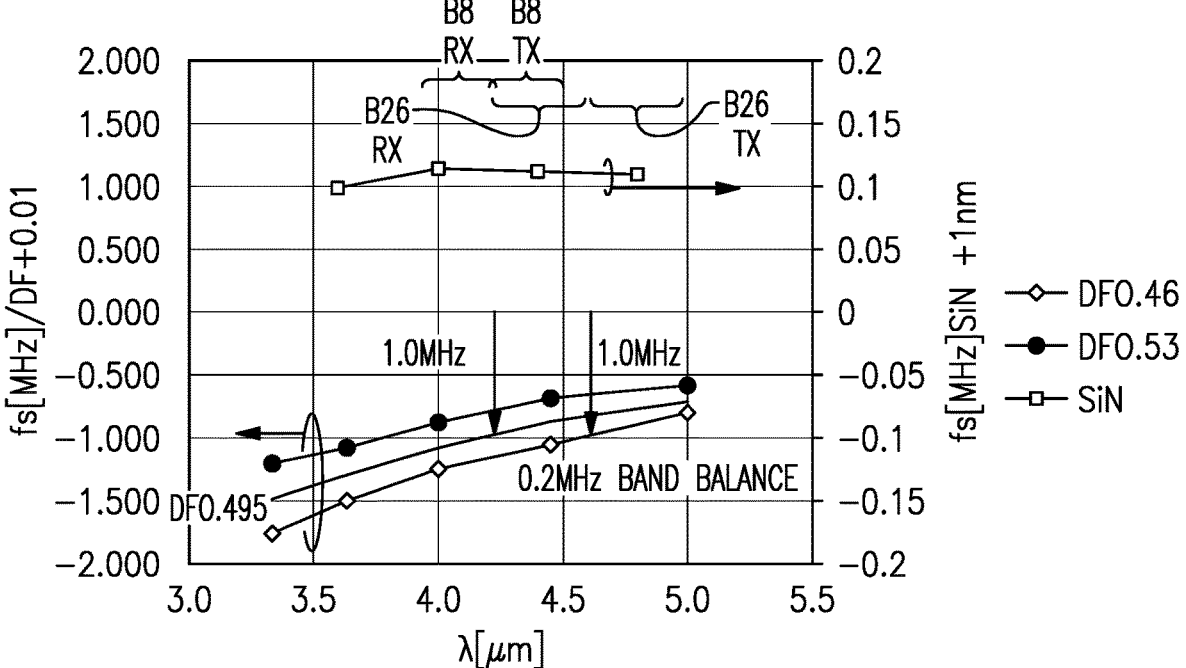
FIG. 6B illustrates how the band imbalance shown in FIG. 6A may be compensated for by utilizing different target duty factors for the interdigital transducer electrodes of the different resonators.
Figure 7A:
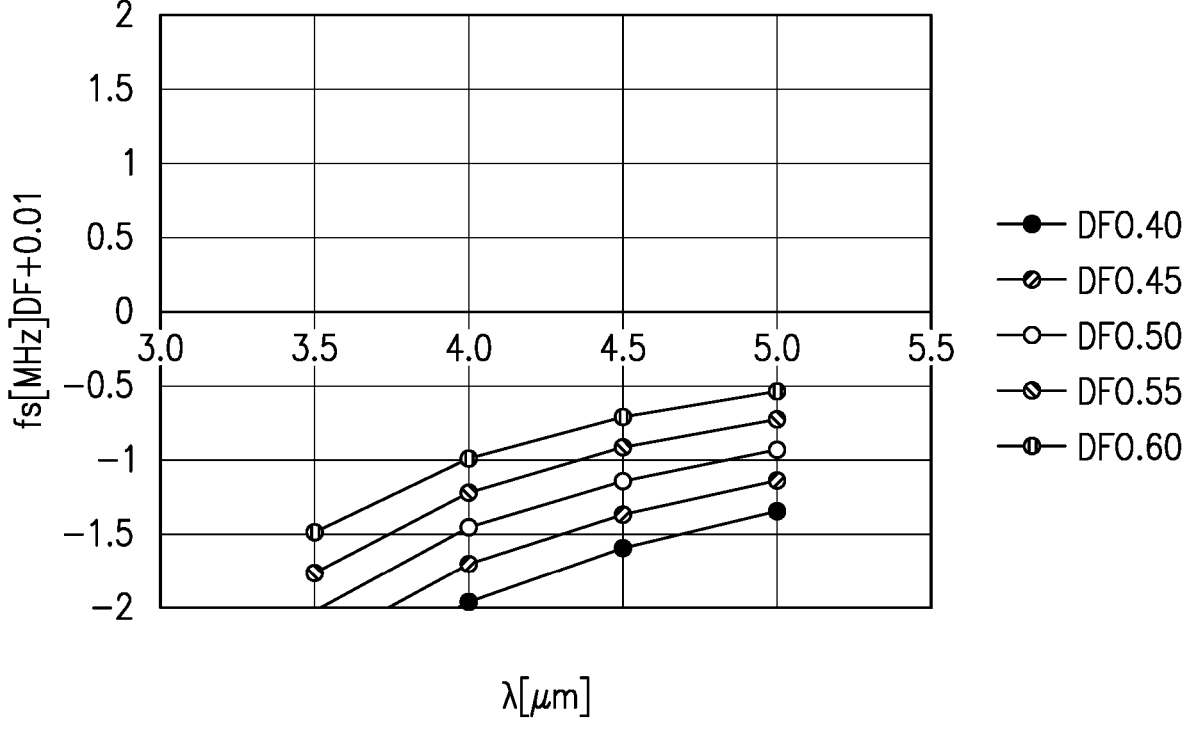
FIG. 7A illustrates measured shift in resonance frequency with a change in duty factor for different surface acoustic wave resonators having multilayer piezoelectric substrates with different target interdigital transducer electrode duty factors and different interdigital transducer electrode pitches.
Figure 7B:
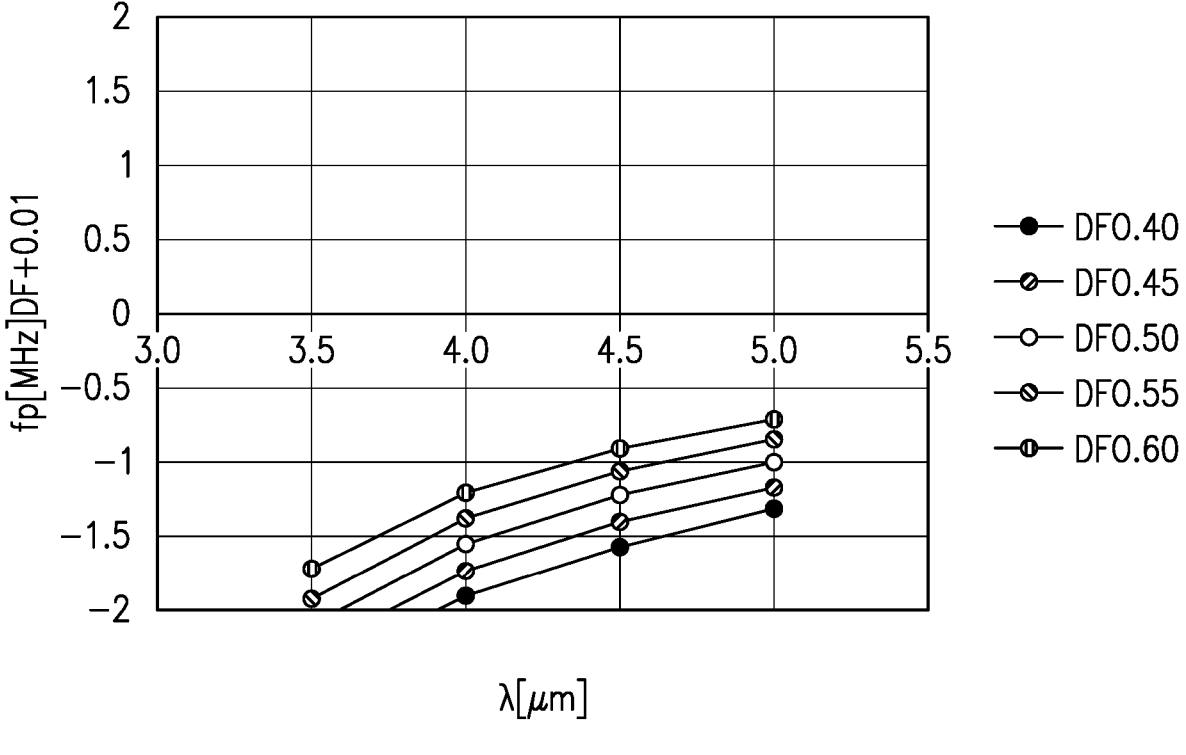
FIG. 7B illustrates measured shift in antiresonance frequency with a change in duty factor for different surface acoustic wave resonators having multilayer piezoelectric substrates with different target interdigital transducer electrode duty factors and different interdigital transducer electrode pitches.

FIGS. 7A and 7B illustrate shift in resonant and antiresonant frequencies measured for MPS SAW resonators with different IDT electrode pitches and target duty factors with a change in duty factor of 0.01. The shifts in resonant and antiresonant frequencies increased with decreasing λ and with decreasing IDT electrode duty factor. The measured frequency shifts shown in FIGS. 7A and 7B are consistent with the simulated frequency shifts shown in FIGS. 6A and 6B.

To remedy the problem with variations in IDT electrode duty factor leading to band imbalance when two filters formed of MPS SAW resonators and with different passbands are formed on the same die, one may form the resonators of the two different filters with different, rather than the same target IDT electrode duty factors. An example of this is shown in FIG. 6B. As shown in FIG. 6B, if one were to form MPS SAW resonators for the B8 filters with target IDT electrode duty factors of 0.495 and MPS SAW resonators for the B26 filters with target IDT electrode duty factors of 0.46, a shift in duty factor of 0.1 due to, for example, manufacturing variability would cause the resonant frequencies of the MPS SAW resonators of the filters for both passbands to shift downward by the same amount, 1.0 MHz for the example illustrated in FIG. 6B. This shift in resonant frequencies could then be compensated for or eliminated, if desired, by frequency trimming to bring the resonant frequencies of the resonators, and thus the passbands of the filters formed from the resonators, back to the target desired frequency ranges.

FIG. 6B also suggests a method by which might set duty factors for MPS SAW resonators for filters operating at different frequencies that would exhibit similar shifts in resonant and antiresonant frequencies (and shift in filter passband) with variation in IDT electrode duty factor so that one may eliminate the effects on band balance of possible variation in IDT electrode duty factor. One could set the duty factor for the IDT electrodes of first MPS SAW resonators intended to be included in a first filter operating at a first passband at a desired value and perform a simulation to determine the shift in resonant and antiresonant frequencies of the first resonators due to a shift in duty factor at the center frequency of the band the first filter is intended for. One could then perform simulations to determine the resonant and antiresonant frequency shifts of second MPS SAW resonators intended for use in a second filter operating at a second passband for different IDT electrode duty factors at the center frequency of the second passband. One could select a duty factor for the IDT electrodes of the second MPS SAW resonators that resulted in the same shift in resonant and antiresonant frequencies at the center frequency of the second passband as the shift in resonant and antiresonant frequencies of the first MPS SAW resonators at the center frequency of the first passband due to a particular shift in IDT electrode duty factor. If the duty factor for the IDT electrodes of the second resonators that would result in the similar frequency shift were lower or higher than desired, one could begin again and start with a higher or lower duty factor, respectively, for the IDT electrodes of the first resonators. One could then form the respective resonators with the respective IDT electrode duty factors and associated filters and perform frequency trimming of the resonators, if desired, should the IDT electrode duty factors of the manufactured devices be off target to restore any loss of band balance.

It is to be appreciated that MPS SAW resonators having target IDT electrode duty factors ranging from 0.35 to 0.65 fall within the scope of this disclosure, as well as filters formed from such resonators. A general design rule that may be adopted in view of this disclosure is to utilize a greater duty factor for MPS SAW resonators with a smaller IDT electrode pitch (higher operating frequency) and a lesser duty factor for MPS SAW resonators with a greater IDT electrode pitch (lower operating frequency).

Figure 8:
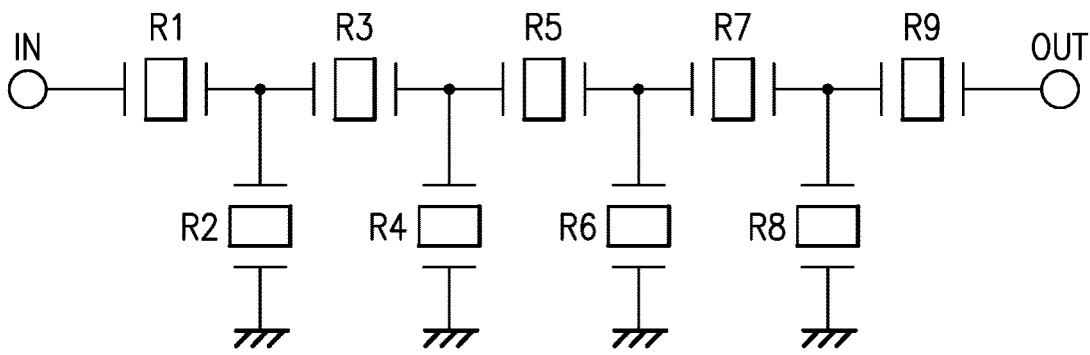
FIG. 8 is a schematic diagram of a radio frequency ladder filter.

In some embodiments, multiple MPS SAW resonators as disclosed herein may be combined into a filter, for example, an RF ladder filter schematically illustrated in FIG. 8 and including a plurality of series resonators R1, R3, R5, R7, and R9, and a plurality of parallel (or shunt) resonators R2, R4, R6, and R8. As shown, the plurality of series resonators R1, R3, R5, R7, and R9 are connected in series between the input and the output of the RF ladder filter, and the plurality of parallel resonators R2, R4, R6, and R8 are respectively connected between series resonators and ground in a shunt configuration. Other filter structures and other circuit structures known in the art that may include MPS SAW devices or resonators, for example, duplexers, baluns, etc., may also be formed including examples of MPS SAW resonators as disclosed herein.

Figure 9:
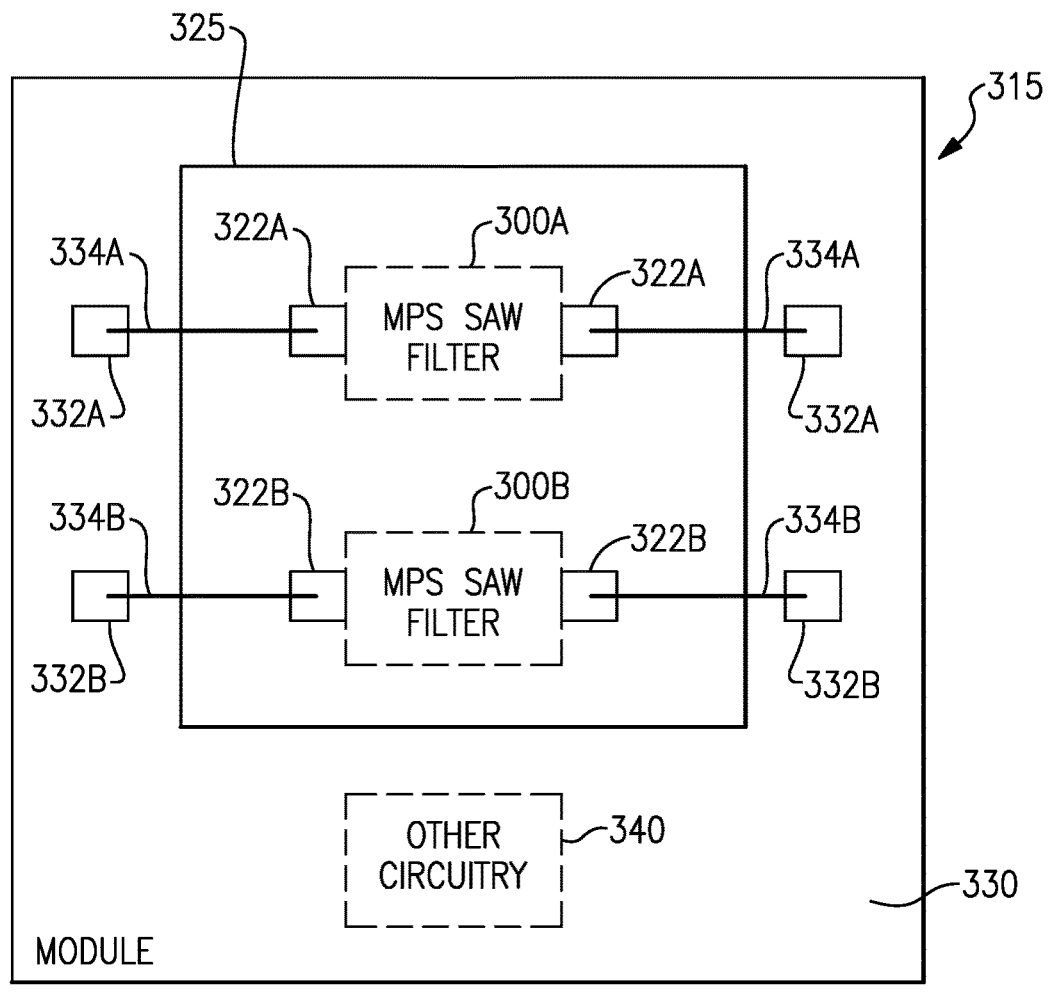
FIG. 9 is a block diagram of one example of a filter module that can include one or more acoustic wave elements according to aspects of the present disclosure.
Figure 10:
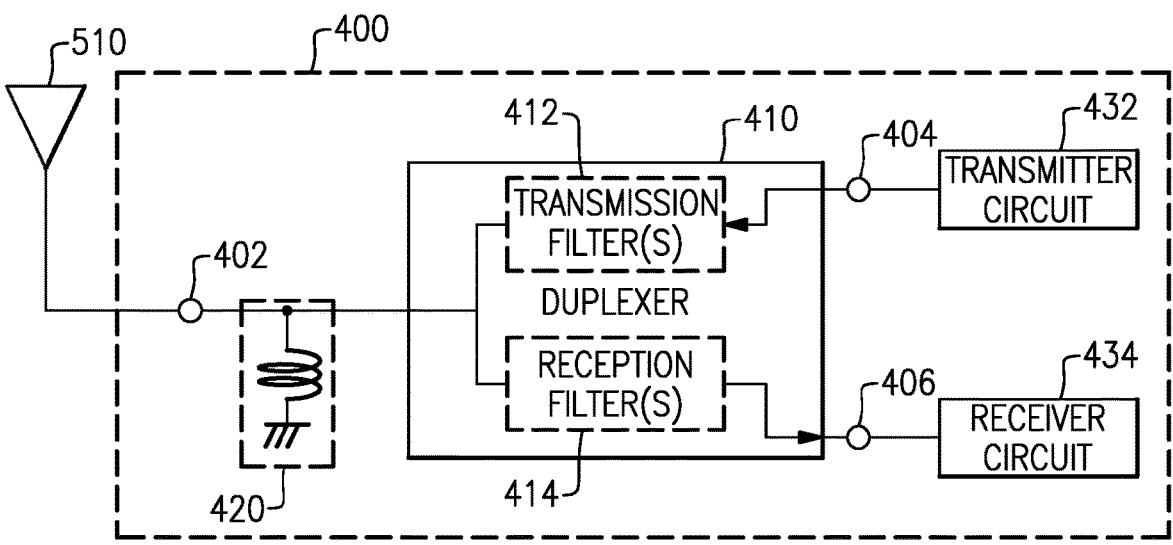
FIG. 10 is a block diagram of one example of a front-end module that can include one or more filter modules according to aspects of the present disclosure.
Figure 11:
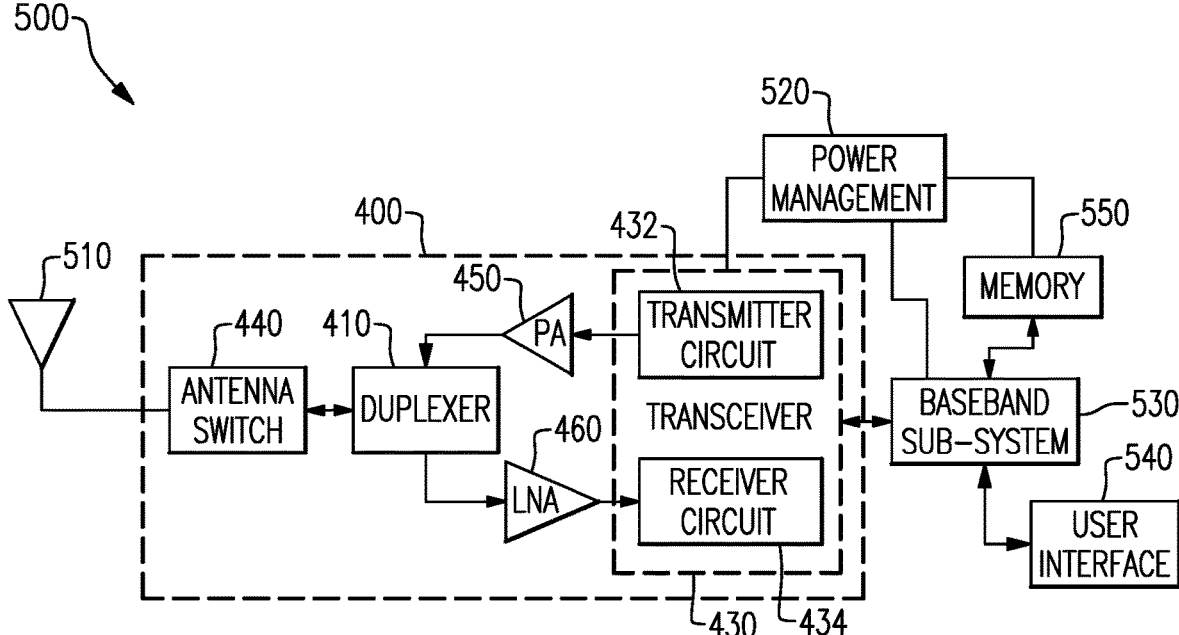
FIG. 11 is a block diagram of one example of a wireless device including the front-end module of FIG. 10.

Examples of the MPS SAW devices, e.g., MPS SAW resonators discussed herein can be implemented in a variety of packaged modules. Some example packaged modules will now be discussed in which any suitable principles and advantages of the MPS SAW devices discussed herein can be implemented. FIGS. 9, 10, and 11 are schematic block diagrams of illustrative packaged modules and devices according to certain embodiments.

As discussed above, MPS SAW resonators can be used in radio frequency (RF) filters. In turn, an MPS SAW RF filter using one or more MPS SAW elements may be incorporated into and packaged as a module that may ultimately be used in an electronic device, such as a wireless communications device, for example. FIG. 9 is a block diagram illustrating one example of a module 315 including two MPS SAW filters 300A, 300B. The MPS SAW filters 300A, 300B may have different operating frequencies and may be formed of MPS SAW resonators having different duty factors as described above. The two MPS SAW filters 300A, 300B may be implemented on the same die 325 or substrate including one or more connection pads 322A, 322B, respectively. For example, the MPS SAW filters 300A, 300B may include connection pads 322A, 322B that correspond to input contacts for the MPS SAW filter and other connection pads 322A, 322B that correspond to output contacts for the MPS SAW filters. The packaged module 315 includes a packaging substrate 330 that is configured to receive a plurality of components, including the die 325. A plurality of connection pads 332A, 332B can be disposed on the packaging substrate 330, and the various connection pads 322A, 322B of the MPS SAW filter die 325 can be connected to the connection pads 332A, 332B on the packaging substrate 330 via electrical connectors 334A, 334B, which can be solder bumps or wirebonds, for example, to allow for passing of various signals to and from the MPS SAW filters 300A, 300B. The module 315 may optionally further include other circuitry die 340, for example, one or more additional filter(s), amplifiers, pre-filters, modulators, demodulators, down converters, and the like, as would be known to one of skill in the art of semiconductor fabrication in view of the disclosure herein. In some embodiments, the module 315 can also include one or more packaging structures to, for example, provide protection and facilitate easier handling of the module 315. Such a packaging structure can include an overmold formed over the packaging substrate 330 and dimensioned to substantially encapsulate the various circuits and components thereon.

Various examples and embodiments of the MPS SAW filters 300A, 300B can be used in a wide variety of electronic devices. For example, the MPS SAW filters 300A, 300B can be used in an antenna duplexer, which itself can be incorporated into a variety of electronic devices, such as RF front-end modules and communication devices.

Referring to FIG. 10, there is illustrated a block diagram of one example of a front-end module 400, which may be used in an electronic device such as a wireless communications device (e.g., a mobile phone) for example. The front-end module 400 includes an antenna duplexer 410 having a common node 402, an input node 404, and an output node 406. An antenna 510 is connected to the common node 402.

The antenna duplexer 410 may include one or more transmission filters 412 connected between the input node 404 and the common node 402, and one or more reception filters 414 connected between the common node 402 and the output node 406. The transmission filters 412 and reception filters 414 may include transmission and reception filters for different frequency bands which may be overlapping or non-overlapping. The passband(s) of the transmission filter(s) are different from the passband(s) of the reception filters. Examples of the MPS SAW filters 300A, 300B can be used to form the transmission filter(s) 412 and/or the reception filter(s) 414. An inductor or other matching component 420 may be connected at the common node 402.

The front-end module 400 further includes a transmitter circuit 432 connected to the input node 404 of the duplexer 410 and a receiver circuit 434 connected to the output node 406 of the duplexer 410. The transmitter circuit 432 can generate signals for transmission via the antenna 510, and the receiver circuit 434 can receive and process signals received via the antenna 510. In some embodiments, the receiver and transmitter circuits are implemented as separate components, as shown in FIG. 10, however, in other embodiments these components may be integrated into a common transceiver circuit or module. As will be appreciated by those skilled in the art, the front-end module 400 may include other components that are not illustrated in FIG. 10 including, but not limited to, switches, electromagnetic couplers, amplifiers, processors, and the like.

FIG. 11 is a block diagram of one example of a wireless device 500 including the antenna duplexer 410 shown in FIG. 10. The wireless device 500 can be a cellular phone, smart phone, tablet, modem, communication network or any other portable or non-portable device configured for voice or data communication. The wireless device 500 can receive and transmit signals from the antenna 510. The wireless device includes an embodiment of a front-end module 400 similar to that discussed above with reference to FIG. 10. The front-end module 400 includes the duplexer 410, as discussed above. In the example shown in FIG. 11 the front-end module 400 further includes an antenna switch 440, which can be configured to switch between different frequency bands or modes, such as transmit and receive modes, for example. In the example illustrated in FIG. 11, the antenna switch 440 is positioned between the duplexer 410 and the antenna 510; however, in other examples the duplexer 410 can be positioned between the antenna switch 440 and the antenna 510. In other examples the antenna switch 440 and the duplexer 410 can be integrated into a single component.

The front-end module 400 includes a transceiver 430 that is configured to generate signals for transmission or to process received signals. The transceiver 430 can include the transmitter circuit 432, which can be connected to the input node 404 of the duplexer 410, and the receiver circuit 434, which can be connected to the output node 406 of the duplexer 410, as shown in the example of FIG. 10.

Signals generated for transmission by the transmitter circuit 432 are received by a power amplifier (PA) module 450, which amplifies the generated signals from the transceiver 430. The power amplifier module 450 can include one or more power amplifiers. The power amplifier module 450 can be used to amplify a wide variety of RF or other frequency-band transmission signals. For example, the power amplifier module 450 can receive an enable signal that can be used to pulse the output of the power amplifier to aid in transmitting a wireless local area network (WLAN) signal or any other suitable pulsed signal. The power amplifier module 450 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 450 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 11, the front-end module 400 may further include a low noise amplifier module 460, which amplifies received signals from the antenna 510 and provides the amplified signals to the receiver circuit 434 of the transceiver 430.

The wireless device 500 of FIG. 11 further includes a power management sub-system 520 that is connected to the transceiver 430 and manages the power for the operation of the wireless device 500. The power management system 520 can also control the operation of a baseband sub-system 530 and various other components of the wireless device 500. The power management system 520 can include, or can be connected to, a battery (not shown) that supplies power for the various components of the wireless device 500. The power management system 520 can further include one or more processors or controllers that can control the transmission of signals, for example. In one embodiment, the baseband sub-system 530 is connected to a user interface 540 to facilitate various input and output of voice and/or data provided to and received from the user. The baseband sub-system 530 can also be connected to memory 550 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 5 GHz, such as in a range from about 600 MHz to 2.7 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A die comprising:
at least two surface acoustic wave resonators having different resonant frequencies, a first of the at least two surface acoustic wave resonators including first interdigital transducer electrodes having a first duty factor and disposed on a multilayer piezoelectric substrate including a layer of piezoelectric material having a lower surface bonded to an upper surface of a layer of a second material different from the piezoelectric material, a second of the at least two surface acoustic wave resonators including second interdigital transducer electrodes having a second duty factor less than the first duty factor and disposed on the multilayer piezoelectric substrate to improve band balance of a device formed from the at least two surface acoustic wave resonators, the first of the at least two surface acoustic wave resonators having a higher resonant frequency than the second of the at least two surface acoustic wave resonators; and
a first radio frequency filter including the first of the at least two surface acoustic wave resonators and a second radio frequency filter including the second of the at least two surface acoustic wave resonators, the first radio frequency filter having a first passband and the second radio frequency filter having a second passband, the first passband having a higher center frequency than the second passband.

2. The die of claim 1 wherein the first and second passbands are overlapping.

3. The die of claim 1 wherein the first and second passbands are non-overlapping.

4. The die of claim 1 further comprising a first duplexer including the first radio frequency filter and a second duplexer including the second radio frequency filter.

5. The die of claim 4 wherein the first duplexer includes a first transmission filter and a first reception filter for a first radio frequency band, the first radio frequency filter being one of the first transmission filter or the first reception filter.

6. The die of claim 5 wherein the second duplexer includes a second transmission filter and a second reception filter for a second radio frequency band, the second radio frequency filter being one of the second transmission filter or the second reception filter.

7. The die of claim 6 wherein the first radio frequency band and second radio frequency band are overlapping.

8. The die of claim 6 wherein the first radio frequency band and second radio frequency band are non-overlapping.

9. The die of claim 1 wherein each of the first duty factor and the second duty factor is between 0.35 and 0.65.

10. The die of claim 1 further comprising a silicon nitride trimming layer disposed on one of the first of the at least two surface acoustic wave resonators or the second of the at least two surface acoustic wave resonators.

11. An electronics module having at least two radio frequency filters formed on a same die, a first of the at least two radio frequency filters including first resonators including a multilayer piezoelectric substrate and first interdigital electrode fingers having a first duty factor disposed on the multilayer piezoelectric substrate, a second of the at least two radio frequency filters including second resonators including second interdigital electrode fingers having a second duty factor greater than the first duty factor disposed on the multilayer piezoelectric substrate, the first radio frequency filter having a first passband and the second radio frequency filter having a second passband, the second passband having a higher center frequency than the second passband.

12. The electronics module of claim 11 wherein the first resonators have lower resonant frequencies than the second resonators.

13. The electronics module of claim 11 further comprising at least two duplexers, a first of the at least two duplexers including the first of the at least two radio frequency filters, a second of the at least two duplexers including the second of the at least two radio frequency filters.

14. An electronic device including the electronics module of claim 13.

15. An electronic device with an electronics module having at least two radio frequency filters formed on a same die, a first of the at least two radio frequency filters including first resonators including a multilayer piezoelectric substrate and first interdigital electrode fingers having a first duty factor disposed on the multilayer piezoelectric substrate, a second of the at least two radio frequency filters including second resonators including second interdigital electrode fingers having a second duty factor greater than the first duty factor disposed on the multilayer piezoelectric substrate, the first radio frequency filter having a first passband and the second radio frequency filter having a second passband, the second passband having a higher center frequency than the second passband.

16. The electronic device of claim 15 wherein the first resonators have lower resonant frequencies than the second resonators.

* * * * *